US009262272B2

(12) United States Patent
Akers et al.

(10) Patent No.: US 9,262,272 B2
(45) Date of Patent: Feb. 16, 2016

(54) DATA CENTER POWER ADJUSTMENT

(71) Applicant: International Business Machines Corporation, Armonk, NY (US)

(72) Inventors: Jason B. Akers, Bay Village, OH (US); Ross B. Clay, Raleigh, NC (US); Ryan A. Holt, Uxbridge, MA (US); Perry L. Jones, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/332,809

(22) Filed: Jul. 16, 2014

(65) Prior Publication Data

US 2014/0331039 A1    Nov. 6, 2014

Related U.S. Application Data

(62) Division of application No. 12/687,241, filed on Jan. 14, 2010, now Pat. No. 8,862,922.

(51) Int. Cl.
*G06F 1/32* (2006.01)
*G06F 11/14* (2006.01)
*H05K 7/14* (2006.01)

(52) U.S. Cl.
CPC .......... *G06F 11/1417* (2013.01); *G06F 1/3206* (2013.01); *G06F 1/329* (2013.01); *G06F 1/3287* (2013.01); *H05K 7/1498* (2013.01); *Y02B 60/1282* (2013.01); *Y02B 60/144* (2013.01); *Y02B 60/148* (2013.01)

(58) Field of Classification Search
None
See application file for complete search history.

(56) References Cited

U.S. PATENT DOCUMENTS

| | | | |
|---|---|---|---|
| 5,448,716 A * | 9/1995 | Hardell et al. | 713/375 |
| 2004/0163001 A1 * | 8/2004 | Bodas | 713/300 |
| 2006/0161307 A1 * | 7/2006 | Patel et al. | 700/277 |
| 2008/0178029 A1 * | 7/2008 | McGrane et al. | 713/324 |
| 2008/0244215 A1 * | 10/2008 | Flemming et al. | 711/173 |
| 2009/0006801 A1 * | 1/2009 | Shultz et al. | 711/170 |
| 2009/0092154 A1 * | 4/2009 | Malik et al. | 370/480 |
| 2009/0144733 A1 * | 6/2009 | Oiwa et al. | 718/1 |

* cited by examiner

*Primary Examiner* — Paul Yanchus, III
(74) *Attorney, Agent, or Firm* — Robert C. Rolnik

(57) ABSTRACT

A power cap agent establishes a power cap. The power cap agent throttles a first power priority virtual machine. The power cap agent determines that the first power priority virtual machine and the additional power priority virtual machine contribute to power consumption above the power cap among the plurality of servers. The power cap agent throttles the additional power priority virtual machine, wherein the first power priority virtual machine has a first power priority lower than an additional power priority of the additional power priority virtual machine. The power cap agent determines that the first power priority virtual machine and the additional power priority virtual machine contribute to power consumption above the power cap, responsive to throttling the first power priority virtual machine and throttling the additional virtual machine.

6 Claims, 5 Drawing Sheets

| VIRTUAL MACHINES | PRIORITY | ALLOW THROTTLE? | ALLOW SHUTDOWN? |
|---|---|---|---|
| VM11, VM12 | 1 | YES | NO |
| VM5, VM6 | 2 | YES | YES |

| LPARS | PRIORITY | ALLOW SHUT OFF? |
|---|---|---|
| LPAR1 | 1 | NO |
| LPAR2 | 2 | YES |

DATA CENTER POWER ADJUSTMENT

This application is a divisional of commonly assigned and co-pending U.S. patent application Ser. No. 12/687,241 entitled "DATA CENTER POWER ADJUSTMENT", filed on Jan. 14, 2010, and hereby incorporated by reference.

BACKGROUND

The present invention relates generally to a computer implemented method, data processing system, and computer program product for responding to power events. More specifically, the present invention relates to responding to calls to scale up or scale down electrical power consumption by selectively increasing or reducing power to virtual partitions.

Electrical power producers respond to overall power consumed on an electrical power grid. When electrical power consumption exceeds a capacity of a grid to provide electrical power, the electrical power producers must change the distribution of electrical power to avoid failures. In the past, these changes in distribution result in the lowering of voltage in electrical power supplied to geographic areas, commonly referred to as a brownout. More drastic changes in the distribution may result in blackouts.

Datacenters are large energy consumers, and thus must often work closely with local power companies. In the event of rolling blackouts or brownouts, power companies may contact large consumers such as datacenters and demand that the datacenter administrators reduce their power consumption in order to reduce demand on the power grid.

SUMMARY

The present invention provides a computer implemented method, data processing system, and computer program product for adjusting power consumed in a data center. A power cap agent establishes a power cap. The power cap agent throttles a first power priority virtual machine. The power cap agent determines that the first power priority virtual machine and the additional power priority virtual machine contribute to power consumption above the power cap among the plurality of servers. The power cap agent throttles the additional power priority virtual machine, wherein the first power priority virtual machine has a first power priority lower than an additional power priority of the additional power priority virtual machine. The power cap agent determines that the first power priority virtual machine and the additional power priority virtual machine contribute to power consumption above the power cap, responsive to throttling the first power priority virtual machine and throttling the additional power priority virtual machine. The power cap agent shuts down the first power priority virtual machine, responsive to a determination that the first power priority virtual machine and the additional power priority virtual machine contribute to power consumption above the power cap.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
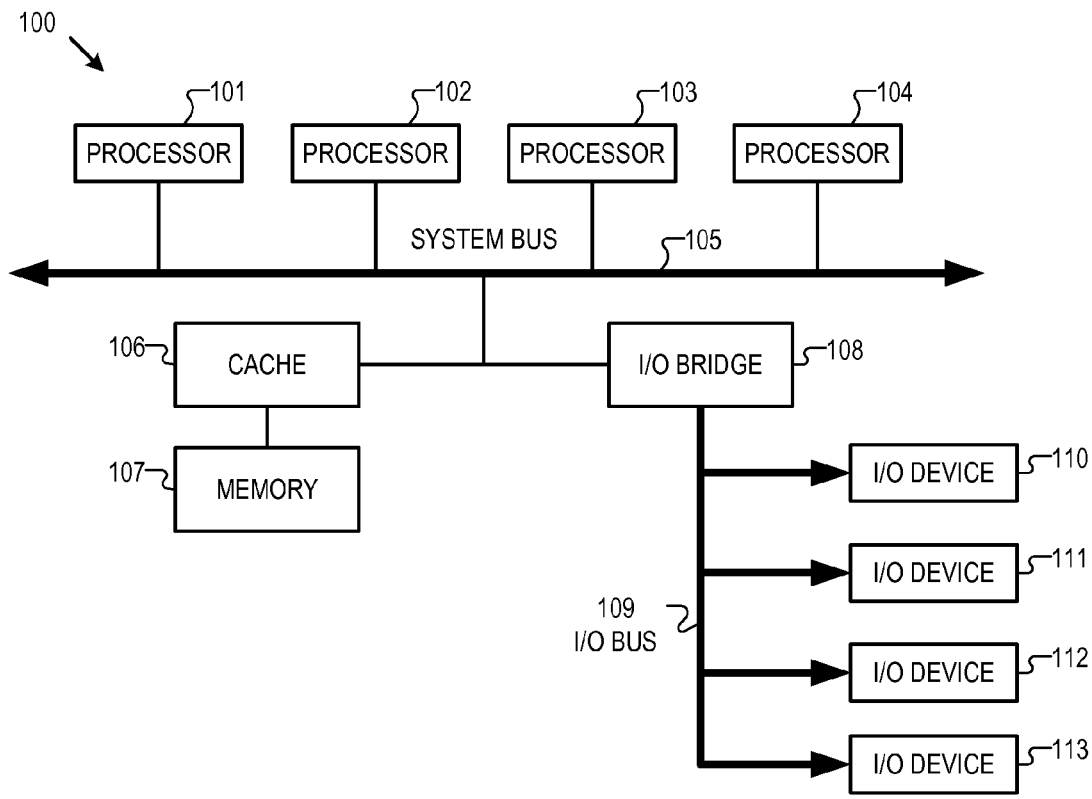
FIG. 1 is a block diagram of a data processing system in accordance with an illustrative embodiment of the invention.
Figures 2, 3, 4:
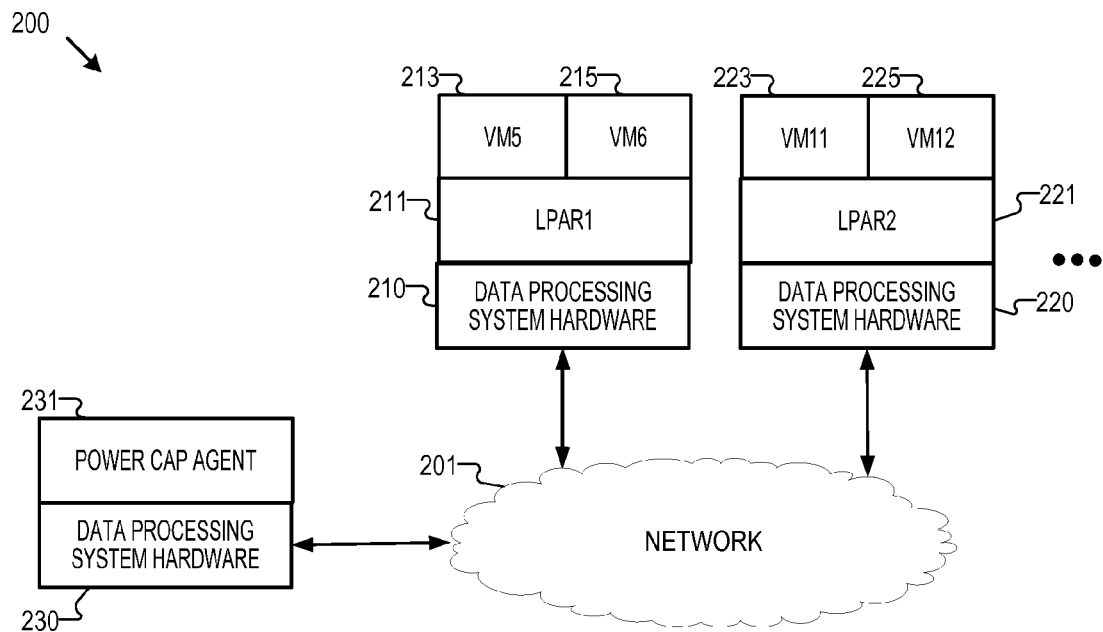
FIG. 2 is a block diagram of a data center in accordance with an illustrative embodiment of the invention.
FIG. 3 is a priority record data structure in accordance with an illustrative embodiment of the invention.
FIG. 4 is an additional power priority record data structure in accordance with an illustrative embodiment of the invention.

Illustrative embodiments of the invention provide a method, apparatus, and computer program product for dispatching workloads to servers, and optionally adjusting processor voltages and frequencies based on resource requirements including power constraints, among others. The data processing device may be a stand-alone computing device, a cluster of computing devices operating as a single system or a distributed data processing system in which multiple computing devices are utilized to perform various aspects of the present invention. Therefore, the following FIGS. 1 and 2 are provided as exemplary diagrams of data processing environments in which the invention may be implemented. FIGS. 1 and 2 are only exemplary and are not intended to assert or imply any limitation with regard to the environments in which the invention may be implemented. Many modifications to the depicted environments may be made without departing from the spirit and scope of the invention.

With reference now to the figures, and in particular with reference to FIG. 1, a block diagram of a data processing system in which the invention may be implemented is depicted. Data processing system 100 may be a symmetric multiprocessor (SMP) system including a plurality of processors 101, 102, 103, and 104 connected to system bus 105. For example, data processing system 100 may be an IBM® Power Systems™ server, a product of International Business Machines Corporation of Armonk, N.Y. Also connected to system bus 105 is memory cache 106, which provides cache memory and an interface to system memory 107. I/O bus bridge 108 is connected to system bus 105 and provides an interface to I/O bus 109. I/O bus 109 connects the I/O bus bridge 108 to a plurality of I/O devices, 110, 111, 112, and 113. Data processing system 100 may be implemented using various commercially available computer systems. For example, data processing system 100 may be implemented using IBM® Power® 595 system available from International Business Machines Corporation. It is appreciated that an I/O device can be, for example, a computer readable storage media. Computer readable storage media includes, for example, magnetic disks, optical disks, and flash memory.

Those of ordinary skill in the art will appreciate that the hardware in FIG. 1 may vary depending on the implementation. Other internal hardware or peripheral devices, such as flash memory, equivalent non-volatile memory, and the like, may be used in addition to or in place of the hardware depicted in FIG. 1. In addition, the processes of the illustrative embodiments may be applied to a multiprocessor data processing system.

In some illustrative examples, data processing system 100 may be a personal digital assistant (PDA), which is configured with flash memory to provide non-volatile memory for storing operating system files and/or user-generated data. A bus system may be comprised of one or more buses, such as a system bus, an I/O bus, and a PCI bus. Of course, the bus system may be implemented using any type of communications fabric or architecture that provides for a transfer of data between different components or devices attached to the fabric or architecture. A communication unit may include one or more devices used to transmit and receive data, such as a modem or a network adapter. A memory may be, for example, system memory 107 or a cache 106. A processing unit may include one or more processors or CPUs. The depicted example in FIG. 1 is not meant to imply architectural limitations. For example, data processing system 100 also may be a tablet computer, laptop computer, or telephone device in addition to taking the form of a PDA.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable storage device(s) may be utilized. The term "computer-readable storage device" does not encompass a signal propagation media. A computer readable storage device may be, for example, but not limited to, an electronic, magnetic, optical, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible device that can store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. Java is a trademark of Sun Microsystems, Inc. in the United States, other countries, or both. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The aspects of the illustrative embodiments provide a data center that operates to respond to power events. The data center responds by adjusting power consumed in response to power events, some of which may be adverse power events. An adverse power event is a signal to reduce electrical power consumption. The signal can be, for example, from an electrical grid operator. Alternatively, the signal can be from a device that operates in response to fluctuations to power consumed or converted by a data center, such as, for example, an air conditioner. Accordingly, the data center may operate under the control of a power cap agent to reduce power consumed by targeted devices and/or software components in the data center following an adverse power event. Similarly, the data center may restore devices and/or software components in response to a positive power event.

FIG. 2 is a block diagram of a data center in accordance with an illustrative embodiment of the invention. A data center is a network of data processing systems that operate at a site to apportion resources among the workloads of one or more customers. Accordingly, network 201 allows multiple data processing centers to communicate with each other, and optionally with additional networks, such as, for example, the Internet. Each data processing system may be, for example, a data processing system such as data processing system 100 of FIG. 1. Each data processing system hardware may form a lowest level of a stack of hardware and software components where successive layers above the hardware level apply greater levels of abstraction to the underlying hardware components.

In the example shown, the data center 200 includes data processing system hardware 210 and data processing system hardware 220. Each data processing system may support one or more logical partitions. A logical partition (LPAR) is an operating system image executing instructions on a data processing system in a manner that permits allocation of excess supporting resources to a parallel or peer operating system image. Operating systems that may be configured to operate in a logical partition include, for example, IBM® z/OS®, IBM® AIX®, Linux®, among others. IBM, z/OS, and AIX are registered trademarks of International Business Machines Corporation in the United States, other countries, or both. Linux® is a registered trademark of Linus Torvalds in the United States, other countries, or both.

LPAR1 211 may rely on an allocation of hardware from data processing system 210. Similarly, LPAR2 221 may rely on allocation of hardware from data processing system hardware 220. It is appreciated that additional data processing systems may be present in data center 200. Moreover, each data processing system may host more than the number of LPARs shown.

Each LPAR supports one or more virtual machines. A virtual machine is a process that executes on a logical partition (LPAR) to perform a function, such as database operations, http service, or any other workload. A virtual machine can be several processes that coordinate together, but are reliant on a single logical partition, or the resources available from a single logical partition. Nevertheless, a virtual machine can cooperate with additional virtual machines to perform, for example, load balancing, where the workload can be shared among several virtual machines. A virtual machine may be instantiated in order to perform any tasks of a workload. Instantiation includes allocating resources reserved by a LPAR to the use of the virtual machine. In contrast, a virtual machine may be shut down. In response to a virtual machine being shut down, any cores that were reserved or shared for use by the virtual machine, may reduce CPU utilization, with an attendant reduction in electrical usage by the one or more cores.

Virtual machines, VM5 213, and VM6 215, are allocated the supporting resources available to LPAR1 211, in this example. Similarly, virtual machines, VM11 223, and VM12 225, are allocated the supporting resources available to LPAR2 221, in this example. Supporting resources are memory, storage, processors and/or processing cores that a LPAR has direct control over by virtue of allocations from a hypervisor. A hypervisor is a software component used to logically partition the hardware into pools of virtualized resources known as logical partitions. A further data processing system may operate to control power usage by data processing hardware of the data center. Data processing system hardware 230 may provide a processor, memory and other data processing system hardware to power cap agent 231. Power cap agent 231 is data processing system instructions executed by the data processing system hardware to command changes in the data center hardware responsive to changing power grid environment. Power cap agent 231 can be, for example, data processing system 100 of FIG. 1. Commands to adjust operating parameters of the data center may be passed via network 201 using known data communication protocols, such as, for example, hypertext transport protocol (HTTP), file transfer protocol (FTP) or secure sockets layer (SSL), among others.

FIG. 3 is a priority record data structure in accordance with an illustrative embodiment of the invention. The priority record data structure 300 is accessed by power cap agent 231 to perform power adjustments in a data center. Initially, the priority record data structure may be input by a data center operator so that each virtual machine has a corresponding power priority. A power priority is an association of a device and/or software component with an order. The order sets the sequence for responsively adjusting the device and/or software component to changing power environment. The software component can be a virtual machine or a logical partition. Changes in the operation of the software component may trigger or be triggered by changes to a supporting resource. A supporting resource is a device that supports a software component. A software component is an LPAR or a virtual partition or processes executing on a data processing system together with associated instructions and data. A power priority virtual machine is a virtual machine that has a corresponding power priority associated with it within a data structure accessible by a power cap agent.

A power priority record is a row in a priority record data structure. For example, a first row in priority record data structure 300 associates virtual machines VM11, and VM12 to power priority 1. Additional associations can describe allowable responses to an adverse power event. For example, virtual machines may be associated with a behavior to allow throttling of the virtual machine. An additional example, virtual machines may be associated with a behavior to allow shutting down of the virtual machines. A throttling is the process of changing one or more clock frequencies or adjusting a voltage to a processor that supports the virtual machine, among other things. The clock frequency is the frequency of the clock signal that gates bits through a processor and/or memory. In addition, throttling can include injecting no-operation machine instructions into a stream of instructions for a processor that supports a virtual machine. A shutting down is the stopping of execution of a process that supports the virtual machine. To shutdown a circuit means that the circuit that supports a virtual machine is either not powered or no clock signal is provided to the circuit. A circuit can be, for example, a processor. If all circuits that support a virtual machine are shut down, then the virtual machine is considered shutdown.

Accordingly, the virtual machines in first power priority row 301 have a higher power priority associated with them as compared to virtual machines in additional rows, such as additional power priority row 311. In additional power priority row 311, virtual machines, VM5 and VM6 are associated with power priority "2". Power priority "2" is a lower power priority than the power priority "1" of first power priority row 301. Thus, a power cap agent may take actions to reduce power consumption to virtual machines associated with the lower power priority before taking actions with respect to virtual machines associated with a higher power priority. Such actions can be in response to an adverse power event.

FIG. 4 is an additional power priority record data structure in accordance with an illustrative embodiment of the invention. In addition to associating virtual machines with power priorities, the power cap agent may associate logical partitions with power priorities. Accordingly, power priority record data structure 400 may store records that associate a power priority with one or more LPARs. For example, LPAR1 211 of FIG. 2 may be associated with a power priority "1", the highest priority. Similarly, LPAR2 221 of FIG. 2 may be associated with a power priority "2", a lower power priority than "1". Each power priority row can be associated with an allowable behavior. The allowable behavior may be shutting off or may not include shutting off but only throttling. The term "shutting off" means that power is removed to one or more circuits in a data processing system. Shutting off can include disabling a clock signal to a processing core. A shut off logical partition is a logical partition that uses a shut off supporting resource, such as, for example, a processing core. A supporting resource is a resource that is allocated to a logical partition. Accordingly, the supporting resource may used by the logical partition when the resource is not shut off. A throttle limit is the lowest frequency and/or voltage that is applied to one or more circuits that support the LPAR. Such a throttle limit may be a tunable value established when configuring a data processing system.

It is appreciated that the entries in each of priority record data structure 300 and table 400 for allowable behaviors may be stored as binary values to indicate whether a behavior is allowed. For example, the binary value "1" may correspond to "yes" or otherwise indicate allowable for the corresponding field or column of the table. Similarly, the binary value "0" may correspond to a "no" or otherwise indicate that a corresponding field or column of the table is disallowed.

Computer instructions may execute as the power cap agent traverses one or more of priority record data structure 300 or table 400 in response to power events. A description of two processes follows. The first process describes how power adjustments occur in response to adverse power events, as may be indicated by a notice of power cap. The second process describes how power adjustments occur in response to a positive power event, as may be indicated by a notice of relieved power cap. The notice of power cap and the notice of relieved power cap may be transmitted according to any messaging or signaling protocol traversing any conduit or by wireless paths. The notices may include an intervening human element whereby a data center operator confirms the notice through use of a user interface.

Figure 5:
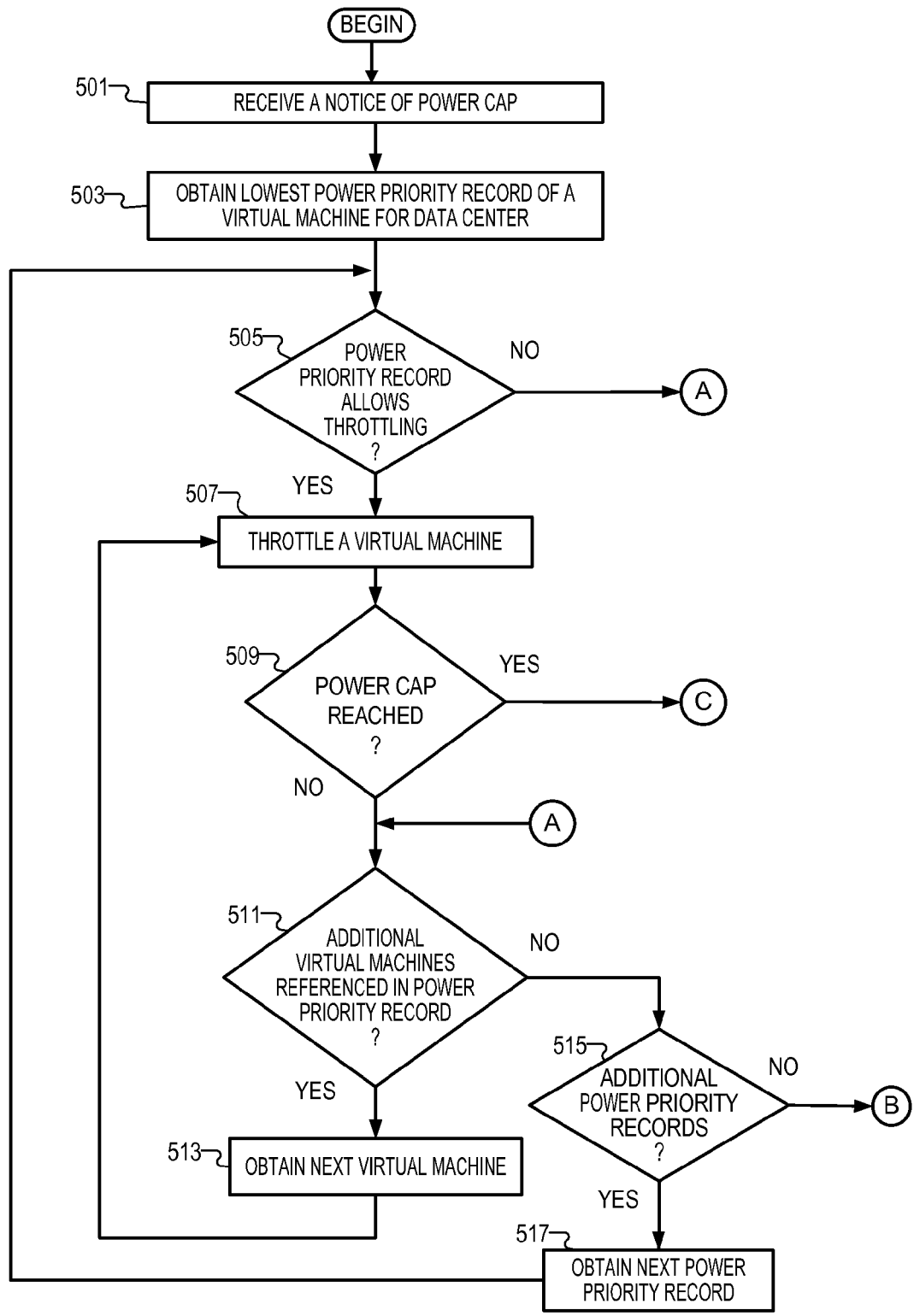
FIG. 5 is a flowchart for performing power adjustments in accordance with an illustrative embodiment of the invention.
Figure 5:
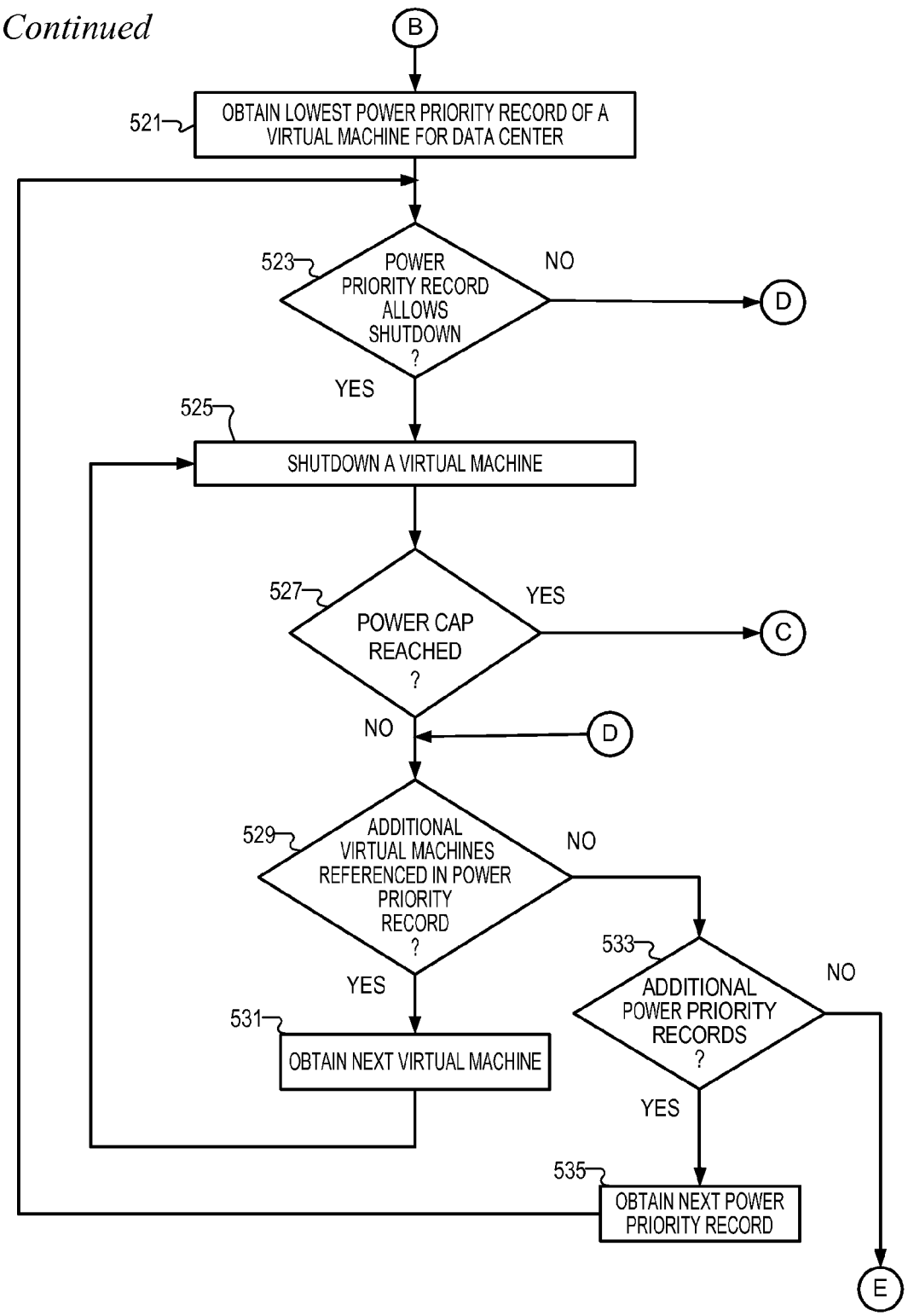
Figure 5:
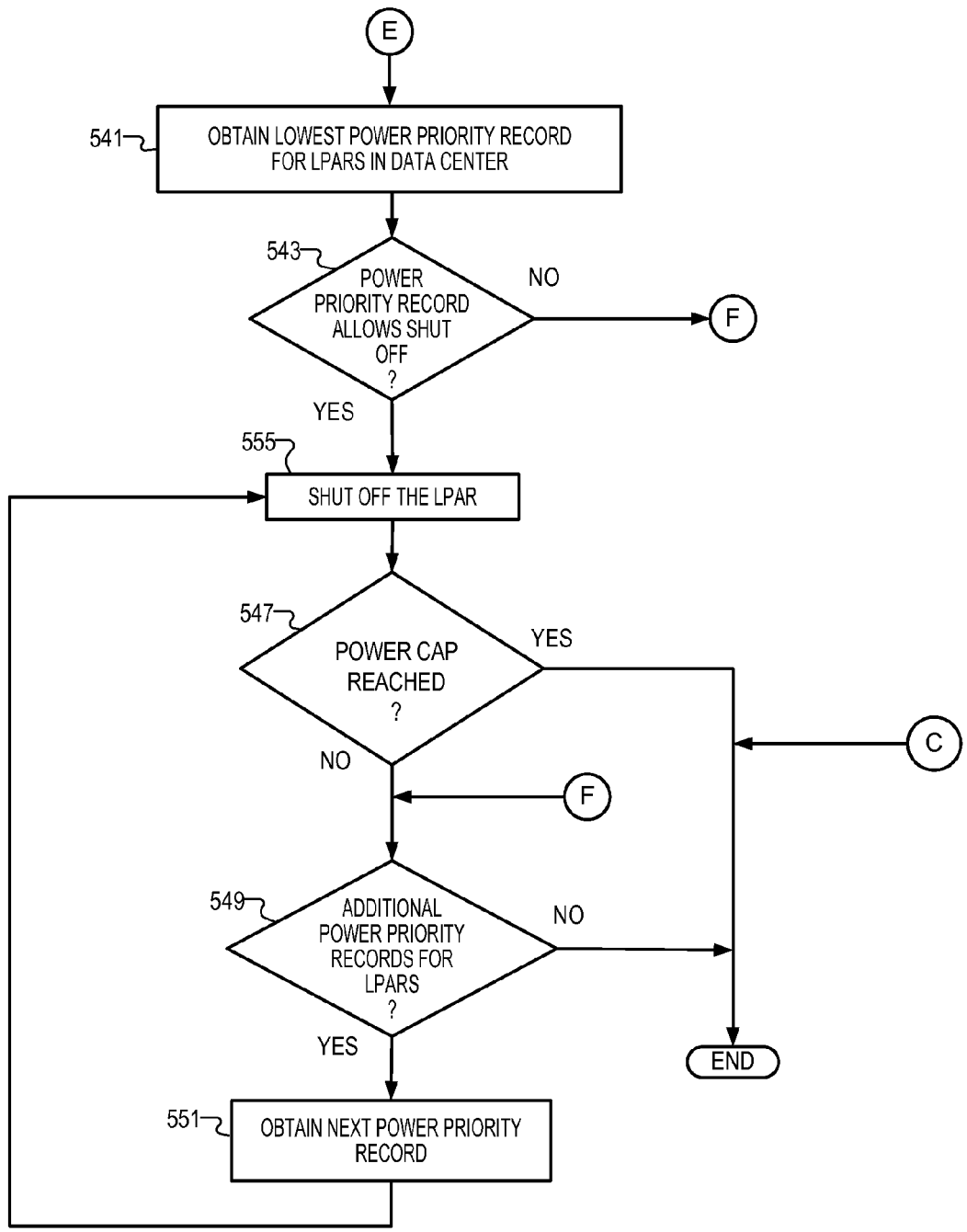

FIG. 5 is a flowchart for performing power adjustments in accordance with an illustrative embodiment of the invention. Initially a power cap agent may receive a notice of power cap (step 501). The power cap agent may be power cap agent 231 of FIG. 2. A notice of power cap is an indication from either upstream power producers or downstream power-related devices that an adverse power event has occurred. Upstream and downstream are relative terms that compare devices that are in a chain of power with a data center. An upstream power producer is a producer of electricity for the data center. A downstream power related device can be, for example, an air-conditioner, which handles heat produced as a byproduct of a data center using electricity.

A notice of power cap may identify the data center in a unique manner and specify an allocated power cap requested of the data center. The power cap may be expressed in watts. Alternatively, the power cap may be expressed as a fraction of a previously agreed power level. Accordingly, the power cap can be a data field within a message known as the notice of power cap. Additional information may be passed with the notice of power cap, such as authentication information. The step of receiving a notice of power cap can be one of several steps to establish a power cap. Further steps or substeps can include validating the received notice as well as authenticating the sender. Various steps within the flowchart of FIG. 5 may compare the power cap to power consumption. Power consumption, in this context, is the electrical power consumed by the data processing system. Like the power cap, the power consumption can be expressed in current, for example, watts.

Next, the power cap agent may obtain a lowest power priority record of a virtual machine within the data center specified in the notice for power cap (step 503). The record may be as described in reference to FIG. 3, above.

Next, the power cap agent may determine if a power priority record allows throttling with respect to virtual machines of the record (step 505). If the priority power record allows throttling, the power cap agent may throttle a virtual machine described in the record (step 507). Next, the power cap agent may determine if the power cap is reached (step 509). The power cap determination occurs by summing the power consumed by all parts of the data center. The data center includes those data processing systems that are on a common power grid circuit. In other words, to the extent that data processing systems in multiple buildings are served by the same electrical provider's power grid circuit, those data processing systems may be included within the data center under control of the power cap agent. Power consumption is measured by use of sensors in each data processing system to obtain real-time energy usage information. Accordingly, the data processing system hardware can provide energy use for each data processing system. If the power cap is not reached, the power cap agent may determine if additional virtual machines are referenced in the power priority record (step 511). If there are additional virtual machines so referenced, the power cap agent may obtain the next virtual machine (step 513). Accordingly, the power cap agent may repeat step 507, as well as one or more of the steps 509 and 511 with respect to the next virtual machine.

At some points, the virtual machines for the priority record are exhausted, and the result at step 511 is negative. In response, the power cap agent may determine whether there are additional power priority records (steps 515). The additional records are in relation to the power record data structure that show allowable behaviors associated with lower power priority than the power priority record already traversed. Accordingly, a positive determination to step 515 leads the power cap agent to obtain a next power priority record (step 517). Next, the power cap agent repeats step 505, and if applicable, steps 507, 509, 511, 513, and 515. A negative result to step 505 leads the power cap agent to perform step 511. Step 505 can be arranged, for example, so that additional virtual machines may be targeted for power reduction.

A positive result to step 509 (power cap reached) may cause the power cap agent to terminate processing. A negative result to step 515 (exhausted additional power priority records) may cause the power cap agent to obtain the lowest power priority record of a virtual machine for the data center (step 521). Next, the power cap agent may determine if the power priority record allows shutdown (step 523). If so, the power cap agent may shut down the virtual machine (step 525). In other words, a shutdown of the virtual machine is allowable. Next, the power cap agent may determine if the power cap is reached (step 527). If the power cap is reached, processing may terminate.

On the other hand, the power cap agent may determine that the power cap was not reached. Accordingly, the power cap agent may determine if additional virtual machine is referenced in the power priority record (step 529). If so, the power cap agent may obtain the next virtual machine (step 531). Next, the power cap agent may repeat step 525 with respect to the virtual machine obtained.

A negative result to step 529 may cause the power cap agent to determine if there are additional power priority records (step 533). If so, then the power cap agent may obtain the next power priority record (step 535). Accordingly, the next step for the power cap agent may be step 523. Additional steps 525-535 may be performed one or more times depending on the results at steps 523, 527, 529, and 533. A negative result at step 523 may result in the power cap agent performing step 529 immediately afterward.

A negative result at step 533 may cause the power cap agent to move to a new phase of processing, namely a phase that iterates over one or more LPARs to further reduce power consumption in the data center. Accordingly, the power cap agent may obtain the lowest power priority record for LPARs in a data center (step 541). The power priority record may be selected for example, from table 400, of FIG. 4. Next, the power cap agent may determine if the power priority record allows shut off (step 543). If shut off is allowed, the power cap agent may shut off the LPAR (step 555). The shutting off of an LPAR can include halting all virtual machines that are executing on the LPAR. Next, the power cap agent may determine whether the power cap is reached (step 547). In response to a positive result, the power cap agent may terminate execution.

However, if the power cap is not reached, the power cap agent may determine whether there are additional power priority records for LPARs (step 549). If not, processing may terminate. However, if so, the power cap agent may obtain a next power priority record (step 551). Accordingly, the power cap agent may repeat step 555 as well as one or more subsequent steps 547-551. A negative result at step 543 causes execution to continue at step 549.

It should be noted that the next power priority record, at steps 517 and 535 are for a power priority record that is a next higher priority than the power priority record just processed, and if there is no next higher power priority record, then the next higher priority level after that. For example, if the priority level just traversed is priority level "3", then the next higher power priority record may be matched to priority level "2". It is noted that a higher priority level is conventionally denoted by a declining numeral associated with the priority that is higher than the priority level that has a numeral.

The flowchart of FIG. 5 iterates first over allowable throttling for virtual machines over all priorities before iterating over allowable shutting down of virtual machines over all priorities. It is appreciated that an alternative flowchart may first iterate over allowable shutting downs before resorting to traversing the priority table to throttle applicable virtual machines.

The FIG. 5 flowchart begins with receiving a notice of power cap. The notice of power cap may originate from varying sources. One source may be an electrical grid provider. An electrical grid provider is an owner or provider of at least one of a) electricity generation; b) electric power transmission; or c) electricity distribution. The actual signal to suppress the power cap may be generated automatically by monitoring equipment of the electrical grid provider. Alternatively, the notice of power cap may be generated, in part, by a human being who makes a judgment concerning suitable entities to scale back power consumption.

An additional source for a notice of power cap can be a computer room air conditioning (CRAC) unit. A notice of power cap can be a signal from a computer room air conditioning unit. A signal from a computer room air conditioning unit may be a signal transmitted when the computer room air conditioning unit fails in some respect. One source of failure can be a coolant leak. In addition, one or more fans or compressors can fail in the CRAC unit. Accordingly, a change in heat transfer characteristics can be predicted by modeling the failure. Based on the predicted heat transfer change, the signal can be transmitted to adjust the power cap specified in the notice of power cap.

Figure 6:
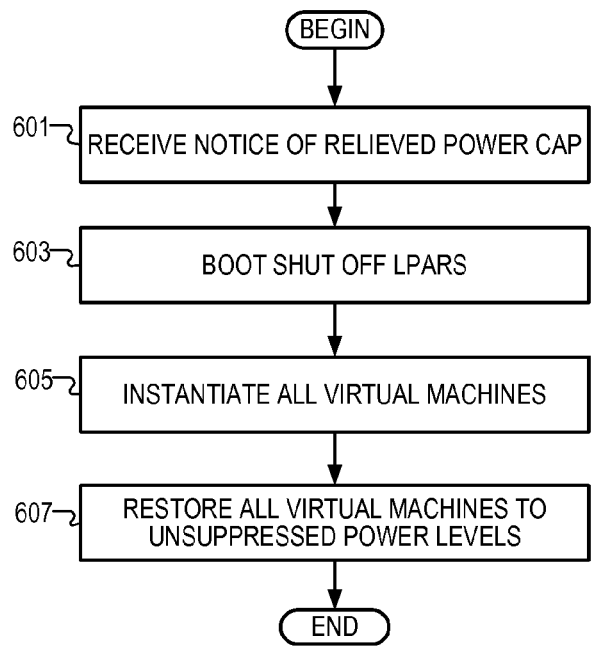
FIG. 6 is a flowchart for relieving power reduction in accordance with an illustrative embodiment of the invention.

FIG. 6 is a flowchart for relieving power reduction in accordance with an illustrative embodiment of the invention. Flowchart 600 may typically be performed by a power cap agent that controls a data center during a period of adverse power conditions. Initially the power cap agent may receive a notice of relieved power cap (step 601). A notice of relieved power cap, like the notice of power cap, may be received from an upstream device or a downstream device. A notice of relieved power cap is an electronic message that indicates to the power cap agent that a previous notice of power cap is relieved, or at least abated. Accordingly, the notice of relieved power cap may cancel the previously received notice of power cap or otherwise remove any established limit to power consumption of the data center. The notice of relieved power cap may originate from a power providing company. Alternatively, the notice of relieved power cap may originate from a computer room air conditioning unit.

Next, the power cap agent may boot the shut off logical partitions (LPARs) (step 603). The shut off logical partitions may be the logical partitions shut off during one or more steps performed by the power cap agent according to processing of flowchart in FIG. 5. Booting can include applying a clock signal to a processing core. A clock signal may be a waveform designed to trigger operation of sequential logic, such as may be found in a processing core. A processing core can be a microprocessor, arithmetic logic unit or other device that executes machine instructions. Next, the power cap agent may instantiate a plurality of power priority virtual machines (step 605). The power priority virtual machines may be the power priority virtual machines shut down by the power cap agent according to processing of flowchart in FIG. 5.

Next, the power cap agent may restore the virtual machines to unsuppressed power levels (step 607). The unsuppressed power level may be a power level that is not established according to the preferences of the data center owner and/or operator. Processing may terminate thereafter.

The notice of relieved power cap may originate from a computer room air conditioning unit. Alternatively, the notice of relieved power cap may originate from an electrical grid provider.

It should be appreciated that further illustrative embodiments may include, as a sub-step to step 607, a step of restoring a virtual machine in steps that include various gradations of increasing power to a virtual machine. Accordingly, intermediate, partially suppressed power levels can be reached before fully restoring the virtual machines to unsuppressed power levels. Such step-wise power restoration can be used in events where a risk of brownout or blackout has abated, but is not entirely fully brought to zero.

The data center responds to notices of power events by adjusting power consumed in response to power events, some of which may be adverse power events. Accordingly, the data center may operate under the control of a power cap agent to reduce power consumed by targeted devices and/or software components in the data center following an adverse power event. Similarly, the data center may restore devices and/or software components in response to a positive power event. Modest steps may be taken prior to taking action that is more drastic. For example, the power cap agent can progressively throttle higher priority virtual machines before turning off underlying LPARs or the supporting data processing hardware.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for restoring power utilization to a data center comprising:
   receiving from a computer room air conditioning unit a notice of relieved power cap, wherein the notice of relieved power cap cancels a previously received request to limit power to a level in the data center, wherein a plurality of shut off logical partitions rely on resources of a data processing system to operate, and in response,
   booting the plurality of shut off logical partitions, wherein booting occurs by applying a clock signal to a data processing core among a plurality of data processing systems in the data center;
   instantiating the plurality of power priority virtual machines by allocating to each power priority virtual machine resources reserved by a logical partition among the logical partitions to the use of the power priority virtual machine, wherein the logical partition is among the logical partitions that were booted in response to receiving from a computer room air conditioning unit a notice of relieved power cap; and
   restoring the plurality of power priority virtual machines by restoring the plurality of power priority virtual machines to a second level greater than the level in the data center, and less than full power, and subsequently restoring the plurality of power priority virtual machines to full power.

2. The computer implemented method of claim 1, wherein booting the plurality of shut off logical partitions causes an increase in power consumed by the data processing system to increase, thereby causing the power consumed by the data center to increase above the level.

3. A computer program product for restoring power utilization to a data center, the computer program product comprising a computer readable storage device having computer readable program code embodied therewith, the computer readable program code comprising:
   computer readable program code configured to receive from a computer room air conditioning unit a notice of relieved power cap, wherein the notice of relieved power cap cancels a previously received request to limit power to a level in the data center, wherein a plurality of shut off logical partitions rely on resources of a data processing system to operate;
   computer readable program code configured to boot the plurality of shut off logical partitions, wherein booting occurs by applying a clock signal to a data processing core among a plurality of data processing systems in the data center, responsive to computer readable program code configured to receive from the computer room air conditioning unit the notice of relieved power cap;
   computer readable program code configured to instantiate the plurality of power priority virtual machines by allocating to each power priority virtual machine resources reserved by a logical partition among the logical partitions, wherein the logical partition is among the logical partitions that were booted in response to receiving from a computer room air conditioning unit a notice of relieved power cap; and
   computer readable program code configured to restore the plurality of power priority virtual machines by restoring the plurality of power priority virtual machines to a second level greater than the level in the data center, and less than full power, and subsequently restoring the plurality of power priority virtual machines to full power.

4. The computer program product of claim 3, wherein computer readable program code configured to boot the plurality of shut off logical partitions causes an increase in power consumed by the data processing system to increase, thereby causing the power consumed by the data center to increase above the level.

5. A computer system for restoring power utilization to a data center, the computer system comprising:
- one or more processors, one or more computer-readable memories, one or more computer-readable storage devices and program instructions, stored on the one or more storage devices for execution by the one or more processors via the one or more memories, the program instructions comprising:
- program instructions to receive from a computer room air conditioning unit a notice of relieved power cap, wherein the notice of relieved power cap cancels a previously received request to limit power to a level in the data center, wherein a plurality of shut off logical partitions rely on resources of a data processing system to operate;
- program instructions to boot the plurality of shut off logical partitions, wherein booting occurs by applying a clock signal to a data processing core among a plurality of data processing systems in the data center, responsive to program instructions to receive from the computer room air conditioning unit the notice of relieved power cap;
- program instructions to instantiate the plurality of power priority virtual machines by allocating to each power priority virtual machine resources reserved by a logical partition among the logical partitions, wherein the logical partition is among the logical partitions that were booted in response to receiving from a computer room air conditioning unit a notice of relieved power cap; and
- program instructions to restore the plurality of power priority virtual machines by restoring the plurality of power priority virtual machines to a second level greater than the level in the data center, and less than full power, and subsequently restoring the plurality of power priority virtual machines to full power.

6. The computer system of claim 5, wherein program instructions to boot the plurality of shut off logical partitions causes an increase in power consumed by the data processing system to increase, thereby causing the power consumed by the data center to increase above the level.

\* \* \* \* \*